United States Patent
Joshi et al.

(10) Patent No.: US 9,974,208 B2
(45) Date of Patent: May 15, 2018

(54) POOL BOILING SYSTEM

(71) Applicant: Toyota Motor Engineering & Manufacturing North America, Inc., Erlanger, KY (US)

(72) Inventors: Shailesh N. Joshi, Ann Arbor, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 445 days.

(21) Appl. No.: 14/666,881

(22) Filed: Mar. 24, 2015

(65) Prior Publication Data

US 2016/0286685 A1 Sep. 29, 2016

(51) Int. Cl.
| | |
|---|---|
| *H05K 7/20* | (2006.01) |
| *H01L 23/427* | (2006.01) |
| *H01L 23/467* | (2006.01) |
| *H01L 23/367* | (2006.01) |
| *B60K 1/00* | (2006.01) |

(52) U.S. Cl.
CPC ....... *H05K 7/20327* (2013.01); *H01L 23/427* (2013.01); *H01L 23/467* (2013.01); *B60K 1/00* (2013.01); *H01L 23/3672* (2013.01)

(58) Field of Classification Search
CPC . H05K 7/20327; H01L 23/427; H01L 23/467; H01L 23/3672; B60K 1/00; F28D 1/02; F28D 2021/0008
USPC ........... 165/104.22, 42, 44; 62/61, 131, 133, 62/241; 244/165; 123/41.43
See application file for complete search history.

(56) References Cited

U.S. PATENT DOCUMENTS

| | | | | |
|---|---|---|---|---|
| 3,273,634 | A * | 9/1966 | Snelling | G01C 19/04 165/104.21 |
| 3,452,948 | A * | 7/1969 | Chang | B64G 1/285 244/165 |
| 3,858,674 | A * | 1/1975 | Tabor | B60K 1/00 180/165 |
| 4,011,919 | A * | 3/1977 | Groeger | B60B 3/048 152/325 |
| 4,679,980 | A | 7/1987 | Bland | |
| 5,587,880 | A | 12/1996 | Phillips et al. | |
| 7,665,511 | B2 | 2/2010 | Bratti et al. | |
| 8,305,759 | B2 | 11/2012 | Attlesey et al. | |

(Continued)

FOREIGN PATENT DOCUMENTS

CN 203332183 12/2013

OTHER PUBLICATIONS

"Space Shuttle Main Engine Orientation"; http://large.stanford.edu/courses/2011/ph240/nguyen1/docs/SSME_PRESENTATION.pdf; Access Date: Jan. 9, 2015.

*Primary Examiner* — Grant Moubry
*Assistant Examiner* — Raheena R Malik
(74) *Attorney, Agent, or Firm* — Dinsmore & Shohl LLP

(57) ABSTRACT

Pool boiling systems, cooling systems configured to cool one or more heat generating portions of a vehicle, and methods of maintaining a functional orientation of a pool boiling unit are disclosed. A pool boiling system may include the pool boiling unit and a stabilizing unit coupled to the pool boiling unit. The stabilizing unit maintains the pool boiling unit in a functional orientation across a plurality of operating orientations of the pool boiling system.

17 Claims, 8 Drawing Sheets

(56) References Cited

U.S. PATENT DOCUMENTS

| | | | | |
|---|---|---|---|---|
| 8,672,062 B2* | 3/2014 | Schroll | ................ | B62D 37/06 |
| | | | | 180/7.1 |
| 2007/0284093 A1* | 12/2007 | Bhatti | ................ | F28D 15/0266 |
| | | | | 165/104.33 |
| 2007/0295488 A1* | 12/2007 | Fielding | ................ | H01L 23/427 |
| | | | | 165/104.33 |
| 2010/0315781 A1* | 12/2010 | Agostini | ............ | F28D 15/0233 |
| | | | | 361/700 |
| 2011/0289951 A1* | 12/2011 | Furlong | ................ | F28B 1/06 |
| | | | | 62/171 |
| 2012/0024499 A1* | 2/2012 | Chang | ................ | F28D 15/0266 |
| | | | | 165/104.25 |
| 2013/0270018 A1 | 10/2013 | Kim et al. | | |
| 2014/0116654 A1 | 5/2014 | McGlaun et al. | | |
| 2015/0029658 A1* | 1/2015 | Yairi | ................ | G06F 1/20 |
| | | | | 361/679.47 |
| 2016/0138522 A1* | 5/2016 | Daviet | ................ | F25B 9/00 |
| | | | | 62/6 |

* cited by examiner

POOL BOILING SYSTEM

TECHNICAL FIELD

The present specification generally relates to component cooling systems and, more specifically, to pool boiling cooling systems that maintain a pool boiling unit in a functional orientation.

BACKGROUND

Electronic components, such as, for example, electronic circuits and components thereof, semiconductor chips, and/or the like generate heat under normal operation. The generated heat can be detrimental to the electronic components and/or surrounding components if it is not appropriately dissipated.

Existing methods for dissipating heat may include, but are not limited to, conduction and heat spreading, air cooling, piezo fans, synthetic jet cooling, nanolightning, liquid, heat pipes, cold plates, microchannels, liquid metal cooling, immersion cooling, liquid jet impingement, spray cooling, solid-state cooling, superlattice cooling, thermionic cooling, heat accumulators, phase change materials, and/or the like. However, certain methods may be inefficient, may be costly, may be inappropriately sized, or may require special configurations for appropriate use. For example, immersion cooling, such as pool boiling (thermosyphon) cooling, requires a very particular orientation to ensure appropriate functionality. Thus, pool boiling systems are ineffective for cooling components that have the potential to move or otherwise fail to remain in a particular orientation, such as components located in a moving vehicle. Previous attempts to solve this issue incorporated particularly shaped devices, such as U-shaped pool boilers or the like. Such particularly shaped devices are costly to build and implement, and require specific machining to build, and still cannot function in any orientation (i.e., the devices will not work if inverted). Other attempts to solve this issue included replacing a pool boiling system with a heat pipe, which incorporates a wick or capillary that allows the device to function while oriented in a wider range of positions. However, such devices cannot be used in any orientation and thus are limited in their application.

Accordingly, a need exists for a pool boiling system that can be used to cool electronics components without regard for a particular orientation.

SUMMARY

In one embodiment, a pool boiling system may include a pool boiling unit and a stabilizing unit coupled to the pool boiling unit. The stabilizing unit maintains the pool boiling unit in a functional orientation across a plurality of operating orientations of the pool boiling system.

In another embodiment, a cooling system configured to cool one or more heat generating portions of a vehicle may include a pool boiling unit thermally coupled to the one or more heat generating portions of the vehicle and a stabilizing unit coupled to the pool boiling unit. The stabilizing unit maintains the pool boiling unit in a functional orientation over a plurality of operating orientations of the vehicle.

In yet another embodiment, a method of maintaining a pool boiling unit in a functional orientation may include monitoring an orientation of the pool boiling unit and, if the orientation of the pool boiling unit is outside the functional orientation, directing a stabilizing unit to orient the pool boiling unit in the functional orientation.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

The systems and methods described herein are generally directed to a pool boiling (thermosyphon) cooling system that incorporates a pool boiling unit and a stabilizing unit to maintain a functional orientation of the pool boiling unit, regardless of the orientation of an object to which the pool boiling cooling system is mounted. Thus, the object may move or otherwise change in orientation, such as an object in a vehicle that moves and causes changes in orientation. However, the stabilizing unit may keep the pool boiling unit in a fixed position regardless of the object's orientation. The fixed position may allow the pool boiling unit to effectively cool heat generating components, such as heat generating components of the vehicle.

Figure 1:
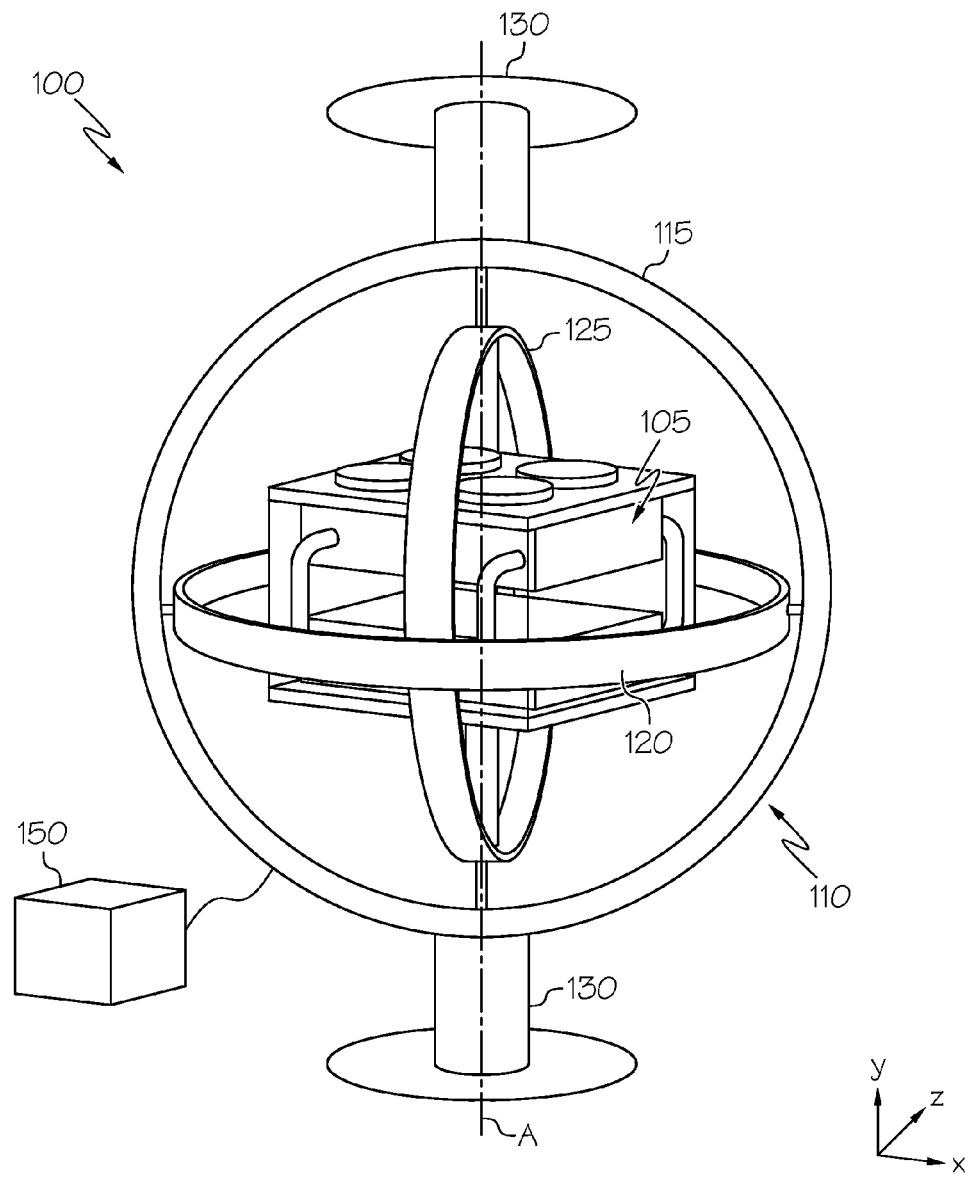
FIG. 1 depicts a side perspective view of an illustrative pool boiling system according to one or more embodiments shown and described herein.

As shown in FIG. 1, a pool boiling system, generally designated 100, may include a pool boiling unit 105 and a stabilizing unit 110. The pool boiling unit 105 may generally be any device configured to cool a thermally coupled object via pool boiling or thermosyphon cooling, as described in greater detail herein. The stabilizing unit 110 may generally be any device that can hold the pool boiling unit 105 in a particular orientation, despite changes in an orientation of an external object, such as an object to which the pool boiling system 100 is mounted, as described in greater detail herein. The stabilizing unit 110 may generally contain an outer ring 115, a first gimbal 120, a second gimbal 125, and one or more external mounts 130, as described in greater detail herein. In some embodiments, the stabilizing unit 110 may be a gyroscope, as described in greater detail herein. The gyroscope may be a passive gyroscope that is generally recognized to move due to external forces, such as the force of gravity, or may be an active gyroscope that can be powered by one or more motors, magnetic devices, and/or the like.

In some embodiments, the pool boiling system 100 may incorporate an electronic system 150 to assist the stabilizing unit 110 in maintaining the orientation of the pool boiling unit 110. The electronic system 150 is not limited by this disclosure and may generally be any electronic system now known or later developed. In some embodiments, the electronic system 150 may be a computing system. Such a computing system may include, but is not limited to, at least one processing device, at least one non-transitory, processor readable storage device, and at least one communications port for sending and/or receiving signals. The non-transitory, processor readable storage device may include programming instructions stored thereon, where the programming instructions direct the processor to carry out one or more processes, such as, for example, various processed described in greater detail herein.

The electronic system 150 may receive signals from the stabilizing unit 110 indicative of various orientations of the outer ring 115, the first gimbal 120, the second gimbal 125, and the pool boiling unit 105. Such signals may be generated by sensors configured to sense the various orientations of the outer ring 115, the first gimbal 120, the second gimbal 125, and the pool boiling unit 105. The electronic system 150 may provide one or more signals to the stabilizing unit 110 that direct the stabilizing unit to change an orientation. In such embodiments, the pool boiling system 100 may incorporate one or more motors, magnetic components, and/or the like that cause the orientation of the stabilizing unit 110 to change orientation in response to the signals from the electronic system 150. For example, if the pool boiling unit 105 is not in a vertical orientation, the electronic system 150 may direct the stabilizing unit 110 to adjust to place the pool boiling unit in a vertical orientation. As used herein, the pool boiling unit 105 may be in a vertical orientation when a central axis A of the pool boiling unit is substantially aligned with the y-axis. The electronic system 150 is not limited by this disclosure and may generally be any electronic device and/or components thereof. Illustrative electronic systems may include, but are not limited to, one or more computing devices, one or more non-transitory storage media, and one or more communications devices. In some embodiments, the electronic system 150 may be a general computing device. The electronic system 150 may be remotely located or may be physically attached to at least a portion of the pool boiling system 100.

Figure 2:
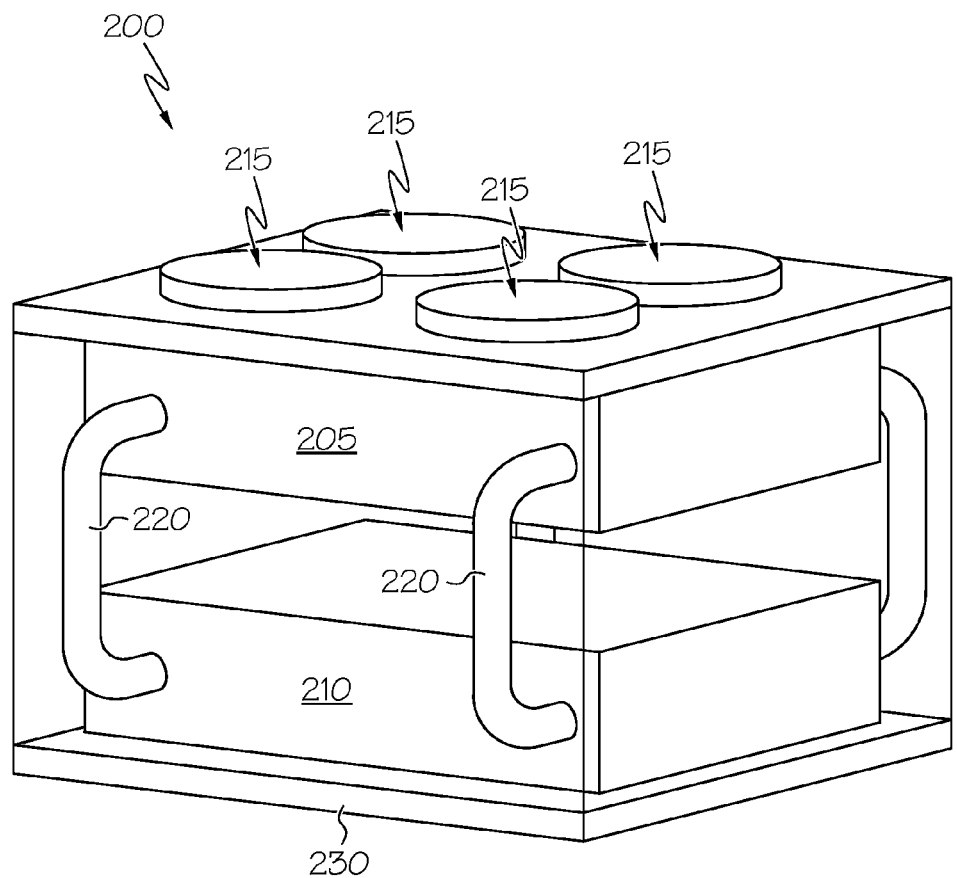
FIG. 2 depicts a side perspective view of an illustrative pool boiling unit according to one or more embodiments shown and described herein.
Figure 2:
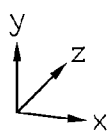
Figure 3:
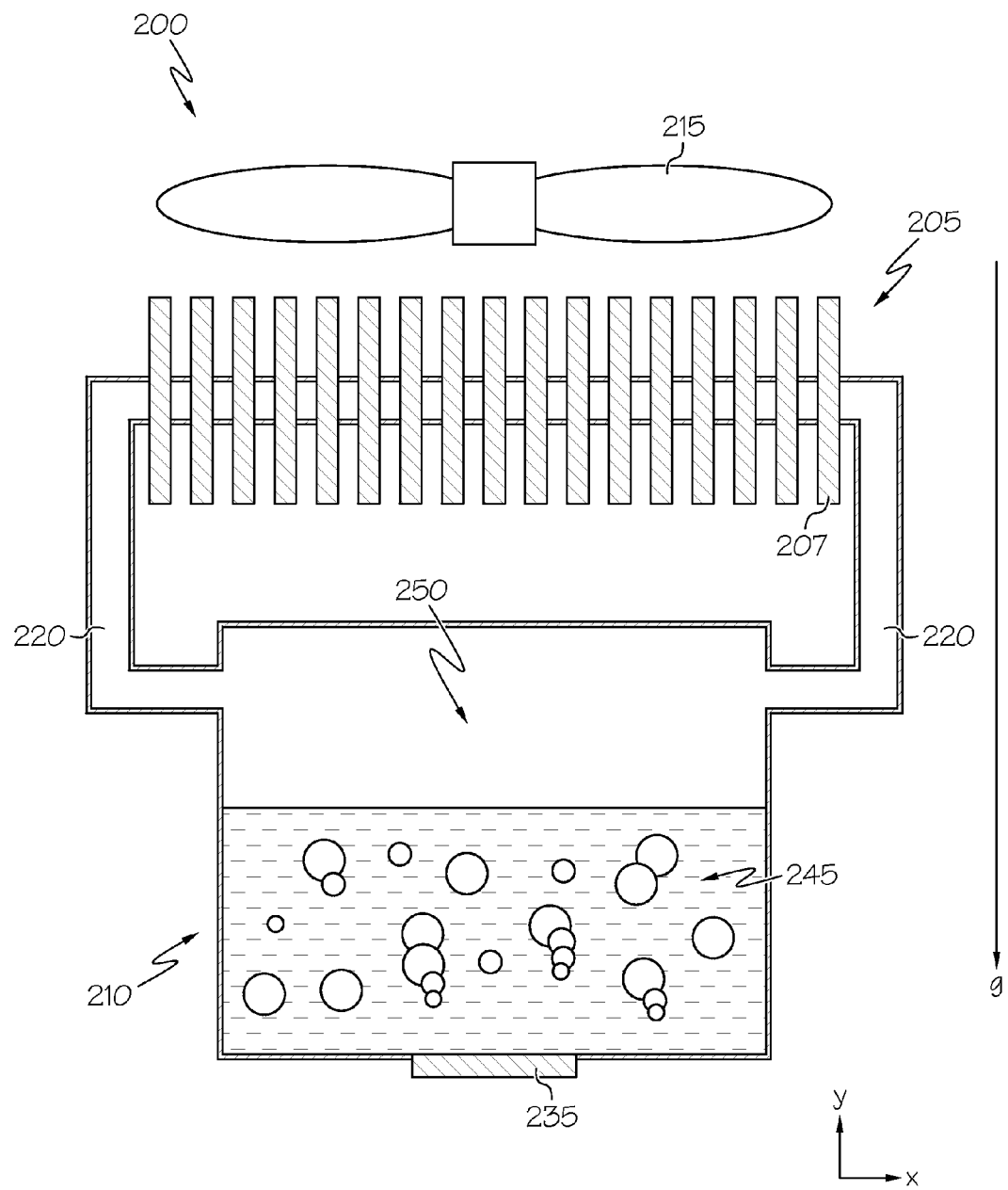
FIG. 3 depicts a cutaway side view of an illustrative pool boiling unit according to one or more embodiments shown and described herein.
Figure 4:
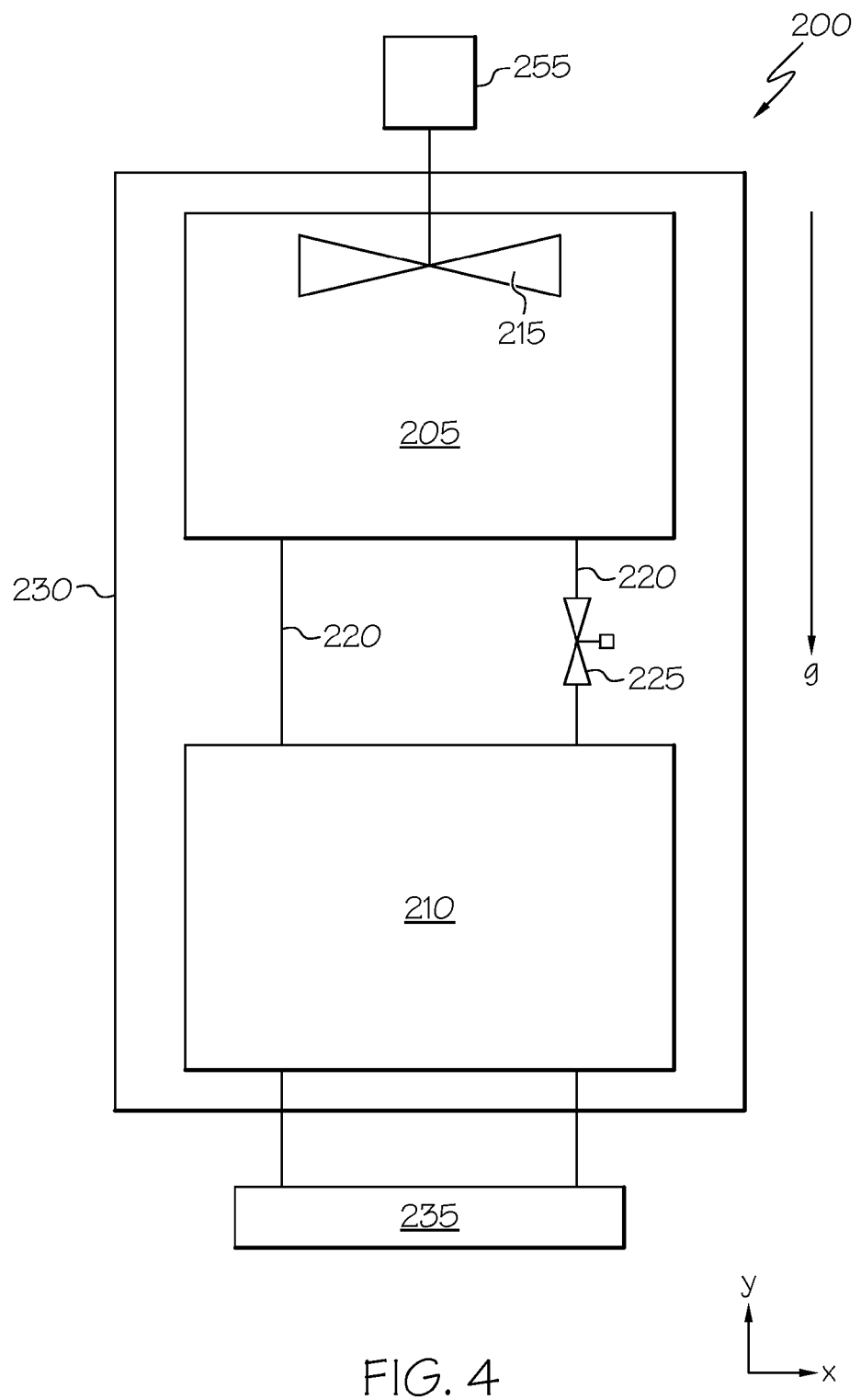
FIG. 4 depicts a schematic view of an illustrative pool boiling unit according to one or more embodiments shown and described herein.

FIGS. 2-4 depict the pool boiling unit, generally designated 200, in greater detail. The pool boiling unit 200, which is a type of thermosyphon, may generally be a closed loop device configured to continuously reuse a fluid that alternates between liquid and vapor form. Accordingly, the pool boiling unit 200 may be capable of functioning without being replenished with additional coolant or the like. The pool boiling unit 200 may function without a wick-like or capillary-like device and without pumps or the like for circulating fluid.

As shown in FIG. 2, the pool boiling unit 200 may include a upper portion 205, a lower portion 210, one or more fans 215, and one or more connections 220 between the upper portion and the lower portion. In some embodiments, the various components of the pool boiling unit may be enclosed in a frame or enclosure 230. The pool boiling unit 200 may generally be aligned such that the upper portion 205 is positioned above the lower portion 210 along a vertical y-axis, which may be generally parallel to the direction of the force of gravity.

As shown in FIG. 3, the upper portion 205 of the pool boiling unit 200 may be or may include a heat exchanger such as, for example, a condenser 207. The condenser 207 is not limited by this disclosure, and may generally be any heat exchanger configured to convert vapor into a liquid. In some embodiments, the condenser 207 may be assisted in the conversion process by the one or more fans 215. Thus, the one or more fans 215 may operate to circulate air to the condenser 207, thereby cooling the condenser, which, in turn, cools the vapor therein, causing it to condense into a liquid.

One such illustrative condenser 207 may be a finned condenser. A finned condenser includes a plurality of plates and finned chambers to transfer heat. One type of finned condenser is a plate-fin heat exchanger. In some embodiments, a finned condenser may be a plain fin condenser, a herringbone fin condenser, a serrated fin condenser, and a perforated fin condenser. A plain fin condenser may generally refer to a condenser that uses a simple straight-finned triangular or rectangular design. A herringbone fin condenser may generally refer to a condenser that uses fins that are placed sideways in a zigzag pattern. A serrated fin condenser and a perforated fin condensers may generally be condensers that contain fins that are cut and perforated, respectively, to augment flow distribution and improve heat transfer.

In various embodiments, the condenser 207 may be arranged such that vapor heated by a heat generating device 235 rises from the lower portion 210 of the pool boiling unit 200, contacts portions of the condenser cooled by the one or more fans 215, and condenses into a liquid. In some embodiments, the condenser 207 may be arranged such that the vapor rises in a generally vertical direction along a y-axis against the force of gravity g. The condensed fluid may fall under force of gravity g out of the condenser 207 and back into the lower portion 210 of the pool boiling unit 200. Such movement of the fluid without mechanical force may be recognized as a natural convection heat transport mechanism. Thus, in some embodiments, the orientation and positioning of the condenser 207 relative to the lower portion 210 of the pool boiling unit must be a functional orientation such that the vapor can rise against the force of gravity and the condensed fluid can fall under the force of gravity accordingly.

Moreover, a functional orientation of the pool boiling unit 200 ensures that at least a portion of the fluid 245 always remains in liquid form in the lower portion 210 at all times. If the orientation were allowed to change such that the liquid fluid 245 were to backflow into the other portions of the pool boiling unit 200, it could cause overheating of the heat generating device 235, which could result in failure or damage. Similarly, if the orientation were allowed to change such that too much liquid fluid 245 were to backflow into the condenser 207, the liquid fluid could freeze in the condenser and cause damage to various components of the pool boiling unit 200. Such freezing would also hinder the natural convection process, which could cause the heat generating device 235 to overheat, thereby potentially resulting in failure or damage.

A buoyancy of the heated fluid and a height difference between the condenser 207 and the lower portion 210 of the pool boiling unit 200 may provide the driving force for circulating the fluid via natural convection. Because the fluid may be circulated using natural convection, the one or more fans 215 may be the only moving parts in the pool boiling unit 200. Accordingly, such a pool boiling unit 200 may used low rates of energy consumption when compared to other cooling devices used to cool electronic components and the like.

As previously described herein, the condenser 207 may cool the vapor via evaporative cooling with ambient air such that the ambient air contacts an outer portion of the condenser and cools the vapor therein. The ambient air may be circulated through the outer portions of the condenser 207 via the one or more fans 215, thereby promoting the cooling process. The one or more fans 215 may be centrifugal or axial fans. As shown in FIG. 4, in some embodiments, the one or more fans 215 may be driven by a motor 255 or the like, such as, for example, a variable speed drive (VSD) or an electronic control module (ECM). In some embodiments, the one or more fans 215 may be omitted.

Returning to FIG. 3, the lower portion 210 of the pool boiling unit 200 may be a reservoir or the like for storing a fluid 245. In some embodiments, the lower portion 210 of the pool boiling unit 200 may be an evaporator or the like for heating the fluid 245. Accordingly, the lower portion 210 may be configured to heat the fluid 245 such that it converts into the vapor state and rises to the upper portion 205. The lower portion 210 may obtain thermal energy for heating the fluid 245 from a heat generating device 235. Thus, the lower portion 210 may be thermally coupled to the heat generating device 235. In some embodiments, the lower portion 210 may be directly connected to the heat generating device 235. In other embodiments, the lower portion 210 may be thermally connected to the heat generating device 235 via a conduit, a thermoconductor, and/or the like (not shown), particularly in embodiments where the heat generating device is remotely located relative to the lower portion.

The heat generating device 235 is not limited by this disclosure, and may generally be any device that generates heat, particularly devices where the generated heat must be mitigated to prevent device malfunction or failure. In some embodiments, the heat generating device 235 may be a vehicle component. In particular embodiments, the heat generating device 235 may be an electronic component, such as a component of a vehicle electronics system. Illustrative electronic components may include, but are not limited to, insulated gate bipolar transistors (IGBT), metal-oxide-semiconductor field effect transistors (MOSFET), power diodes, power bipolar transistors, power thyristor devices, and the like.

The fluid 245 is not limited by this disclosure, and may generally include any working fluid that is suitable for use in pool boiling systems. Illustrative working fluids may include, but are not limited to, water, alcohol, and refrigerants. In some embodiments, the alcohol may be methanol. Illustrative refrigerants may include, but are not limited to, ammonia, ethyl chloride, methyl chloride, sulphur dioxide, fluorocarbons, hydrocarbons, hydrofluorocarbons (HFC), and halogenated hydrocarbons. In a particular embodiment, the refrigerant may be 1,1,1,2-tetrafluoroethane (R-134a). In another particular embodiment, the refrigerant may be a glycol compound. Illustrative glycol compounds include, but are not limited to, ethylene glycol, isopropylene glycol, 1,2-dimethylethylene glycol, diethylene glycol, diisopropylene glycol, bis(1,2-dimethylene) glycol, triethylene glycol, triisopropylene glycol, tetraethylene glycol, tetraisopropylene glycol, pentaethylene glycol, pentaisopropylene glycol, and the like, and mixtures thereof. In some embodiments, the refrigerant may be a dielectric material. Illustrative dielectric materials may include, but are not limited to, epoxy polymers, polyimides, polyesters, polyisoprenes, and/or the like. In some embodiments, the refrigerant may be FLUORINERT™ (Minnesota Mining and Manufacturing Company, St. Paul, Minn.).

In various embodiments, the fluid 245 may be passed between the upper portion 205 and the lower portion 210 via the one or more connections 220. The one or more connections 220 are not limited by this disclosure, and may generally be any conduit or passageway configured to permit movement of fluid therethrough, whether in liquid or vapor form. In some embodiments, as shown in FIG. 4, the one or more connections 220 may incorporate one or more valves 225 to promote collection of the fluid in the upper portion 205 and/or the lower portion 210. Thus, the one or more valves 225 may stop the flow of fluid through the one or more connections 220, thereby inhibiting the circulation of fluid through the pool boiling unit 200. In some embodiments, the one or more valves 225 may be controlled by a control device, such as the control device described in greater detail herein. For example, if a temperature sensor senses an unsafe temperature in a portion of the pool boiling unit 200, it may transmit a signal to the control device, which may determine to close the one or more valves 225 and transmit a signal to the one or more valves to close. Once the temperature is back within a safe range, the control device may transmit a signal to the one or more valves 225 to reopen.

In some embodiments, the pool boiling unit 200 may be devoid of any residual fluids to ensure optimum heat transfer performance. Thus, in some embodiments, the pool boiling unit 200 may be evacuated of such residual fluids once the fluid 245 is placed therein. Evacuation may include vacuum sealing, which reduces pressure inside the pool boiling unit 200 to promote heat transfer characteristics. Removal of such residual fluid may avoid deterioration of the heat transfer characteristics, avoid alteration of the properties of the fluid 245, and ensures removal of heat at high heat fluxes while maintaining low surface temperatures on the walls of the pool boiling unit 200.

As previously described herein, the pool boiling unit 200 should be maintained in a particular position to ensure proper function. Specifically, the pool boiling unit 200 should be maintained in a functional (vertical) orientation to ensure that the upper portion 205 is located above the lower portion 210 at all times so that the fluid can move upwards against the force of gravity in a vapor state and move downwards with the force of gravity in a liquid state. Thus, when the pool boiling unit 200 is configured to cool an object that may constantly move or change in orientation, such as a vehicle when the pool boiling unit is disposed in the vehicle, the stabilizing unit 110 (FIG. 1) may maintain the vertical orientation of the pool boiling unit across any of the operating orientations of the pool boiling system.

In some embodiments, the pool boiling unit 200 may also incorporate a control device (not shown) that may be configured to receive signals from various portions of the pool boiling unit and transmit signals to the pool boiling unit or an external device. The control device may be similar to the electronic device described in greater detail herein, or may be integrated with the electronic device. The control device may be used to monitor the functionality of the pool boiling unit 200 and/or various components thereof. To effect monitoring, in some embodiments, the pool boiling unit 200 may include one or more sensors, such as, for example, temperature sensors, flowmeters, and/or the like. The one or more sensors may transmit signals corresponding to sensed properties to the control device and/or receive signals from the control device.

Figure 5:
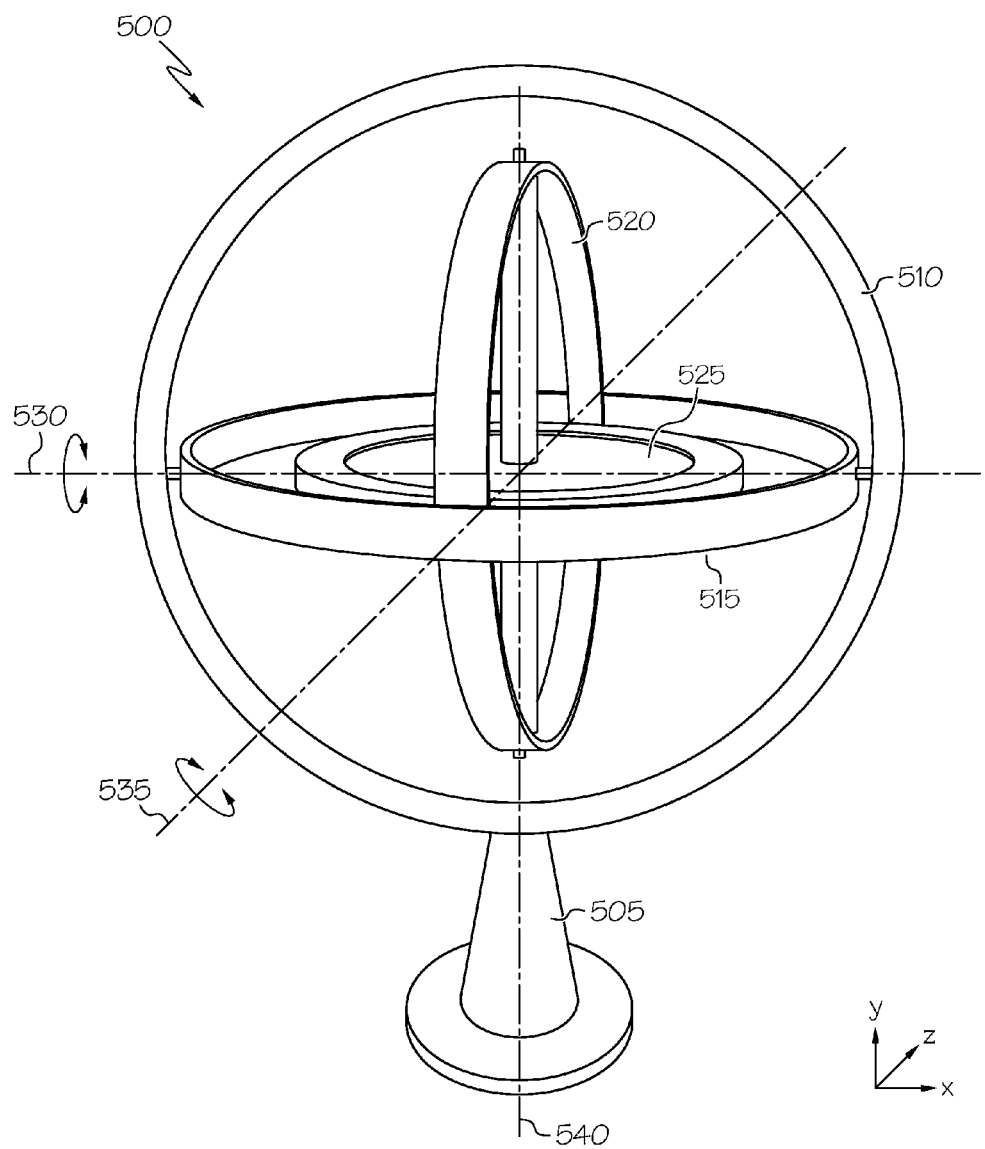
FIG. 5 depicts a side view of an illustrative stabilizing unit according to one or more embodiments shown and described herein.

FIG. 5 depicts movement of an illustrative stabilizing unit, generally designated 500, according to various embodiments. In some embodiments, the stabilizing unit 500 may be a Cardan suspension, as described in greater detail herein. While the stabilizing unit 500 depicted herein is a gyroscopic stabilizing unit, such depiction is merely illustrative. Accordingly, it will be recognized that other stabilizing units now known or later developed that can be configured to maintain the pool boiling unit in a vertical orientation are not limited by the scope of the present disclosure.

In various embodiments, the stabilizing unit 500 may include an outer ring 510 mounted to one or more external mounts 505, a first gimbal 515, and a second gimbal 520. The one or more external mounts 505 may be affixed to a portion of a base surface or fixed surface, such as a vehicle component, a frame, or the like. While only one external mount 505 is depicted, it may be recognized that additional mounts may be used without departing from the scope of the present disclosure. When a plurality of external mounts 505 are used, each mount may independently be affixed to a portion of a base surface.

In some embodiments, the outer ring 510 may be mounted to the one or more external mounts 505 in a fixed location. Thus, the outer ring 510 may not be capable of movement relative to the one or more external mounts 505. In other embodiments, the outer ring 510 may be rotatably mounted to an external mount 505 such that the outer ring is configured to rotate about an axis that runs perpendicular to a plane that extends between the outer ring and the external mount at a mount point. The outer ring 510 may be any size or shape, and may generally be constructed of a rigid material. While the size and shape of the outer ring 510 is not limited by this disclosure, it will be recognized that the outer ring may be shaped and sized to accommodate movement of the first gimbal 515 and the second gimbal 520 without hindrance, as described in greater detail herein. The outer ring 510 may also be shaped and sized to accommodate the first gimbal 515, the second gimbal 520, and the pool boiling unit (not shown) therein.

The first gimbal 515 may be rotatably mounted to the outer ring 510 along a first gimbal axis 530 that runs perpendicular to a plane that extends between the outer ring and the first gimbal at a mount point. In some embodiments, the first gimbal axis 530 may be parallel to a horizontal x-axis running through the pool boiling unit when it is arranged in the vertical orientation described herein. The first gimbal 515 may freely rotate about the first gimbal axis 530 without hindrance. Accordingly, the first gimbal 515 may be sized and shaped such that its movement about the first gimbal axis 530 is not hindered by the outer ring 510. The first gimbal 515 may also be shaped and sized to accommodate the second gimbal 520 and the pool boiling unit therein. Similar to the outer ring 510, the first gimbal 515 may be constructed of a rigid material.

The second gimbal 520 may be rotatably mounted to the first gimbal 515 along a second gimbal axis 535 that runs perpendicular to a plane that extends between the first gimbal and the second gimbal at a mount point. In some embodiments, the second gimbal axis 535 may be parallel to a horizontal z-axis running through the pool boiling unit when it is arranged in the vertical orientation described herein. In some embodiments, the second gimbal 520 may freely rotate about the second gimbal axis 535 without hindrance. In some embodiments, the second gimbal 520 may be vertically fixed such that it holds the pool boiling unit in a vertical orientation while the first gimbal 515 and the outer ring 510 rotate accordingly to accommodate changes in orientation caused by the surface(s) to which the one or more external mounts 505 are affixed. The second gimbal 520 may be sized and shaped such that various movement is not hindered by the outer ring 510 or the first gimbal 515. The second gimbal 520 may also be shaped and sized to accommodate the pool boiling unit therein. Similar to the outer ring 510 and the first gimbal 515, the second gimbal 520 may be constructed of a rigid material.

The pool boiling unit (not shown) may be mounted in its vertical orientation to the second gimbal 520. In some embodiments, the frame or enclosure 230 (FIG. 2) may be attached to the second gimbal 520. In some embodiments, the second gimbal 520 may be fixed in a vertical direction, but may be configured to rotate about a third gimbal axis 540 that runs perpendicular to a plane that extends between the second gimbal and the pool boiling unit at a mount point. In some embodiments, the third gimbal axis 540 may be parallel to a vertical y-axis running through the pool boiling unit, which is perpendicular to the x-axis and the z-axis. In some embodiments, the pool boiling unit may be mounted on a horizontal plate 525 that is supported by the second gimbal 520. The horizontal plate 525 may generally provide additional support for the pool boiling unit inside the stabilizing unit 500. In some embodiments, the horizontal plate 525 may be positioned adjacent to a flywheel that spins about the third gimbal axis 540 to maintain the vertical orientation of the pool boiling unit. In such embodiments, the horizontal plate 525 may be in a fixed configuration such that the pool boiling unit does not spin with the flywheel, so as to avoid centrifugal and centripetal forces from disrupting the fluid movement inside the pool boiling unit.

Figure 6A:
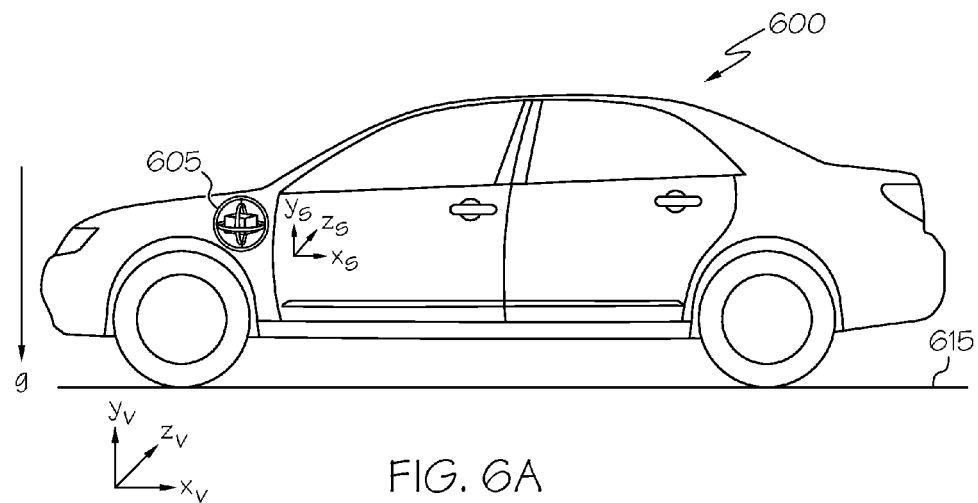
FIGS. 6A and 6B depict a side view of an illustrative vehicle containing a pool boiling system in various orientations according to one or more embodiments shown and described herein.
Figure 6B:
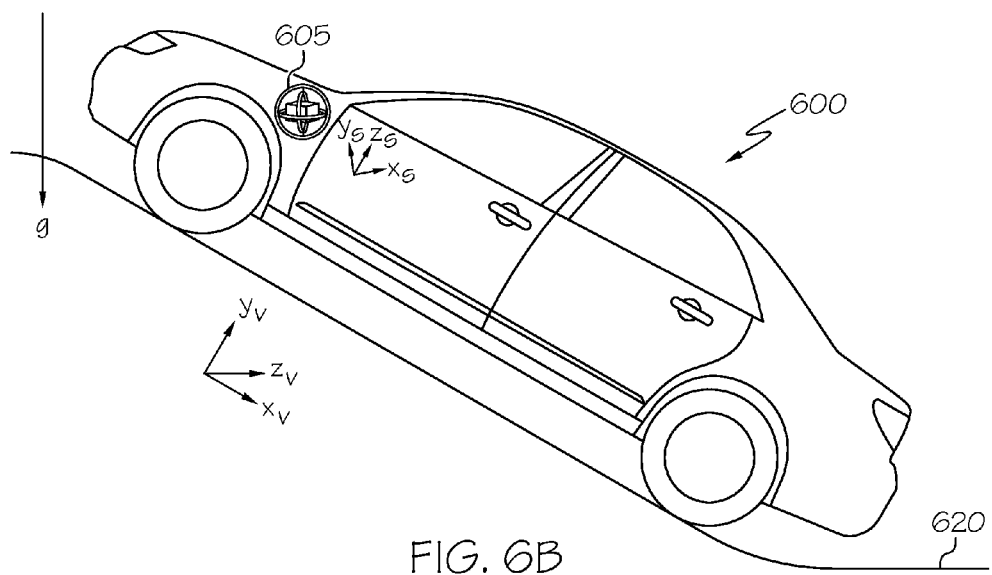
Figure 7A:
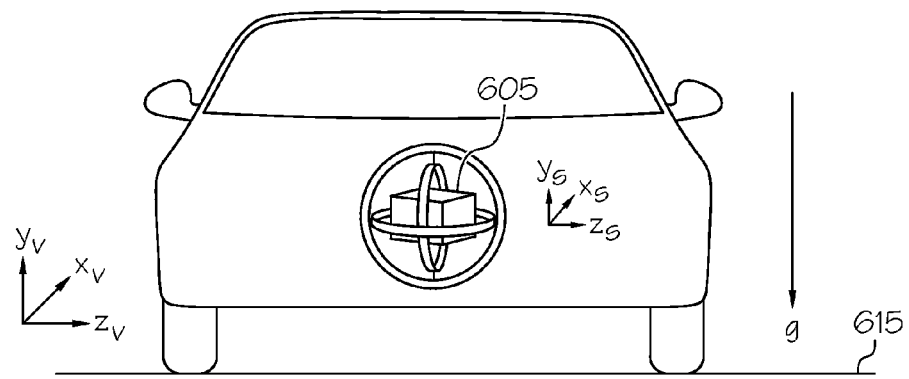
FIG. 7A-7C depict a front cutaway view of an illustrative vehicle containing a pool boiling system in various orientations according to one or more embodiments shown and described herein.
Figure 7B:
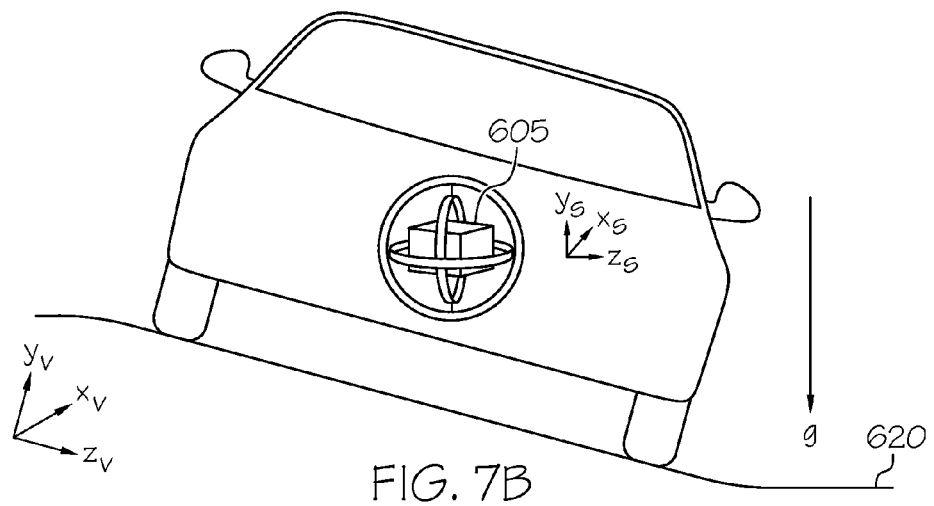
Figure 7C:
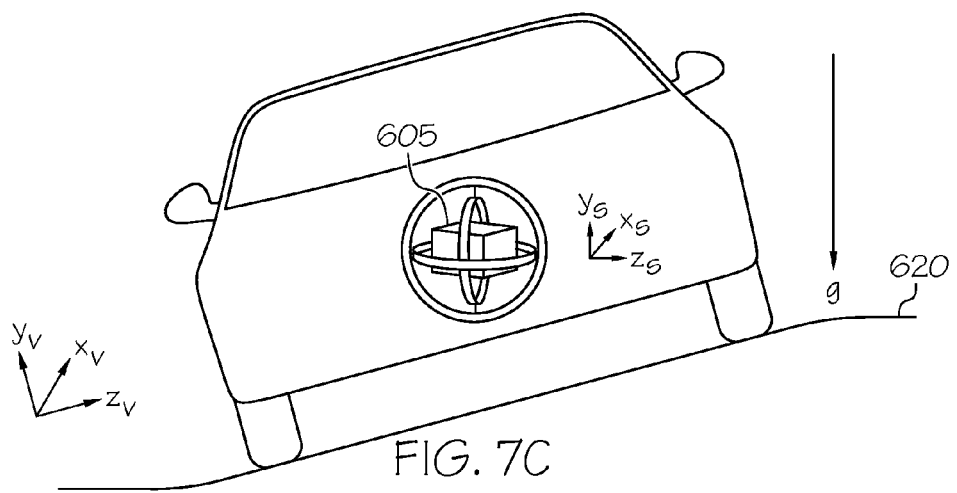

The various rotations of the gimbals 515, 520 and, optionally, the outer ring 510 may result in a Cardan suspension of the pool boiling unit within the stabilizing unit 500. Accordingly, the pool boiling unit may always remain in its vertical positioning parallel to the direction of the force of gravity, regardless of the orientation of the base surface(s) to which the one or more external mounts 505 are affixed. As such, the pool boiling unit can always function for vapor to flow against the force of gravity from the lower unit to the upper unit and liquid to flow with the force of gravity from the upper unit to the lower unit. Illustrative orientation(s) of base surfaces are shown in FIGS. 6A-6B (side view of the vehicle) and 7A-7C (front view of the vehicle). For example, as shown in FIGS. 6A and 7A, when a vehicle 600 is on a horizontal surface 615, the coordinates of the vehicle ($x_v$, $y_v$, $z_v$) may be parallel to the corresponding coordinates of the pool boiling unit in the pool boiling system 605 ($x_s$, $y_s$, $z_s$). Thus, the respective vertical coordinates $y_v$, $y_s$ may be parallel to the force of gravity g and the respective horizontal coordinates $x_v$, $z_v$, $x_s$, $z_s$ may be perpendicular to the force of gravity. When the vehicle 600 traverses an incline 620 as shown in FIGS. 6B, 7B, and 7C, the coordinates of the pool boiling unit in pool boiling system 605 ($x_s$, $y_s$, $z_s$) may remain the same (i.e., the vertical coordinate $y_s$ is parallel to the force of gravity g and the horizontal coordinates $x_s$, $z_s$ are perpendicular to the force of gravity). However, the coordinates of the vehicle 600 ($x_v$, $y_v$, $z_v$) change according to the pitch and/or roll of the incline 620.

The gyroscope stabilizing unit 500 described herein is merely illustrative. As such, it will be recognized that other stabilizing units that can maintain the pool boiling unit in a functional orientation are within the scope of the present disclosure. For example, the stabilizing unit 500 may be a mounting plate connected to two or more servo motors that are configured to maintain the pool boiling unit in a vertical orientation.

Figure 8:
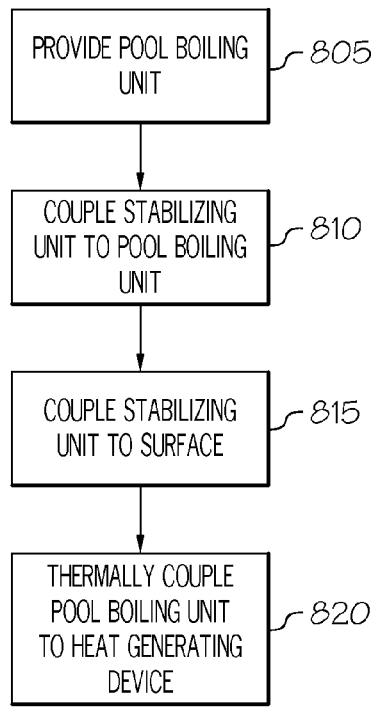
FIG. 8 depicts a flow diagram of an illustrative method of assembling a pool boiling system according to one or more embodiments shown and described herein.

FIG. 8 depicts a flow diagram of a method of assembling a pool boiling system according to various embodiments. The method may include providing 805 the pool boiling unit, such as, for example, the pool boiling unit described herein. The stabilizing unit may be coupled 810 to the pool boiling unit such that the stabilizing unit maintains the orientation of the pool boiling unit, as described in greater detail herein. Coupling 810 may be by any means of fixture now known or later developed for joining two elements together.

The assembled pool boiling system including the stabilizing unit and the pool boiling unit may be attached to a target area. For example, the stabilizing unit may be coupled 815 to a base surface and the pool boiling unit may be thermally coupled 820 to a heat generating device. In embodiments where the target area is a vehicle, the stabilizing unit may be coupled 815 to a frame or other base surface of the vehicle and the pool boiling unit may be thermally coupled 820 to a target heat generating device, as described in greater detail herein.

In some embodiments, the pool boiling system may be calibrated to ensure that the pool boiling unit is in a vertical orientation when the pool boiling system is attached to the target area. Calibration may include, for example, adjusting the positioning and connections of various portions of the pool boiling system to ensure vertical orientation of the pool boiling unit. In some embodiments, the calibration may be completed by an electronic device coupled to the pool boiling system, such as the electronic device described in greater detail herein. In other embodiments, the calibration may be completed manually.

Figure 9:
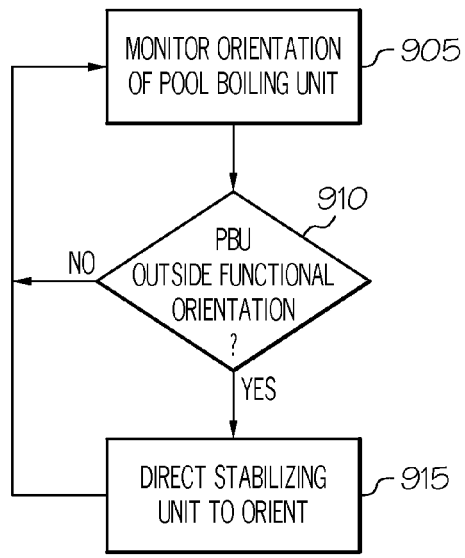
FIG. 9 depicts a flow diagram of an illustrative method of maintaining a functional orientation of a pool boiling unit according to one or more embodiments shown and described herein.

FIG. 9 depicts a flow diagram of a method of maintaining a pool boiling unit in a functional orientation. Such a method may be completed manually or may be completed with a computing device, such as the electronic device 150 described with respect to FIG. 1. The method may include monitoring 905 the orientation of the pool boiling unit. Monitoring 905 the orientation may include, for example, monitoring the orientation of various portions of the stabilizing unit to ensure that the various portions are holding the pool boiling unit in the functional orientation. The various portions may be any portion described in greater detail herein, including the outer frame, the first gimbal and/or the second gimbal. In some embodiments, monitoring 905 the orientation may include receiving one or more signals that indicate the orientation. As described in greater detail herein, such signals may be received from one or more sensors mounted to various portions of the stabilizing unit, one or more imaging devices, and/or the like.

The method may further include determining 910 whether the pool boiling unit is outside a functional orientation. As described in greater detail herein, the functional orientation may be a substantially vertical orientation such that a vertical axis of the pool boiling unit is aligned with and/or parallel to a y-axis that corresponds to the direction of the force of gravity. If the pool boiling unit is within the functional orientation, monitoring 905 may continue.

If the pool boiling unit is not within the functional orientation, the method may include directing 915 the stabilizing unit to orient the pool boiling unit. Directing 915 the stabilizing unit to orient may include, for example, transmitting one or more signals to one or more portions of the stabilizing unit to move such that the pool boiling unit is placed in the functional orientation, as described in greater detail herein.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A pool boiling system comprising:
   a pool boiling unit; and
   a stabilizing unit coupled to the pool boiling unit, wherein the stabilizing unit maintains the pool boiling unit in a vertical orientation across a plurality of operating orientations of the pool boiling system.

2. The pool boiling system of claim 1, wherein the pool boiling unit is thermally coupled to a heat generating device such that the pool boiling unit cools the heat generating device by pool boiling cooling.

3. The pool boiling system of claim 1, wherein the stabilizing unit is a gyroscope.

4. The pool boiling system of claim 3, wherein the gyroscope comprises:
   an outer frame coupled to a fixed surface such that the outer frame pivots about a first axis that extends perpendicularly from the fixed surface;
   a first gimbal pivotally mounted to the outer frame such that the first gimbal rotates about a second axis that is perpendicular to the first axis;
   a second gimbal pivotally mounted to the first gimbal such that the second gimbal rotates about a third axis that is perpendicular to the second axis; and
   the pool boiling unit pivotally mounted to the second gimbal.

5. The pool boiling system of claim 1, further comprising an electronic device configured to receive one or more signals from the stabilizing unit and direct the stabilizing unit to adjust an orientation of the stabilizing unit to maintain the pool boiling unit in the vertical orientation.

6. The pool boiling system of claim 1, wherein the pool boiling unit comprises:
   a heat exchanger;
   a reservoir for containing a fluid in a liquid state, wherein the reservoir is thermally coupled to a heat generating device;
   a conduit fluidly coupling the heat exchanger with the reservoir such that the fluid circulates between the heat exchanger and the reservoir by natural convection; and one or more fans positioned adjacent to the heat exchanger, wherein the one or more fans promote cooling of the fluid in the heat exchanger.

7. The pool boiling system of claim 6, wherein the fluid is a dielectric material.

8. The pool boiling system of claim 6, wherein the heat exchanger is a finned condenser.

9. A cooling system for cooling one or more heat generating components of a vehicle, the cooling system comprising:
 a pool boiling unit thermally coupled to the one or more heat generating components of the vehicle; and
 a stabilizing unit coupled to the pool boiling unit, wherein the stabilizing unit maintains the pool boiling unit in a vertical orientation over a plurality of operating orientations of the vehicle.

10. The cooling system of claim 9, wherein the stabilizing unit is a gyroscope.

11. The cooling system of claim 10, wherein the gyroscope comprises:
 an outer frame coupled to a fixed surface such that the outer frame pivots about a first axis that extends perpendicularly from the fixed surface;
 a first gimbal pivotally mounted to the outer frame such that the first gimbal rotates about a second axis that is perpendicular to the first axis;
 a second gimbal pivotally mounted to the first gimbal such that the second gimbal rotates about a third axis that is perpendicular to the second axis; and
 the pool boiling unit pivotally mounted to the second gimbal.

12. The cooling system of claim 9, further comprising an electronic device configured to receive one or more signals from the stabilizing unit and direct the stabilizing unit to adjust an orientation of the stabilizing unit to maintain the pool boiling unit in the vertical orientation.

13. The cooling system of claim 9, wherein the pool boiling unit comprises:
 a heat exchanger;
 a reservoir for containing a fluid in a liquid state, wherein the reservoir is thermally coupled to a heat generating device;
 a conduit fluidly coupling the heat exchanger with the reservoir such that the fluid circulates between the heat exchanger and the reservoir by natural convection; and
 one or more fans positioned adjacent to the heat exchanger, wherein the one or more fans promote cooling of the fluid in the heat exchanger.

14. The cooling system of claim 13, wherein the fluid is a dielectric material.

15. A method of maintaining a pool boiling unit in a vertical orientation, the method comprising:
 monitoring an orientation of the pool boiling unit; and
 if the orientation of the pool boiling unit is not in a vertical orientation, directing a stabilizing unit to orient the pool boiling unit in the vertical orientation.

16. The method of claim 15, wherein monitoring the orientation comprises monitoring at least one of the following portions of the stabilizing unit: an outer frame, a first gimbal, and a second gimbal.

17. The method of claim 15, wherein monitoring the orientation comprises receiving one or more signals from the stabilizing unit indicative of the orientation of the pool boiling unit.

* * * * *

UNITED STATES PATENT AND TRADEMARK OFFICE
CERTIFICATE OF CORRECTION

PATENT NO. : 9,974,208 B2
APPLICATION NO. : 14/666881
DATED : May 15, 2018
INVENTOR(S) : Shailesh N. Joshi and Ercan Mehmet Dede It is certified that error appears in the above-identified patent and that said Letters Patent is hereby corrected as shown below:

In the Specification

In Column 5, Line 12, after "may", delete "used" and insert --use--, therefor.

Signed and Sealed this
Second Day of July, 2019

Andrei Iancu
*Director of the United States Patent and Trademark Office*